US006414888B2

(12) United States Patent
Kitade et al.

(10) Patent No.: US 6,414,888 B2
(45) Date of Patent: *Jul. 2, 2002

(54) SEMICONDUCTOR STORAGE DEVICE HAVING BURN-IN MODE

(75) Inventors: Osamu Kitade; Tetsushi Hoshita, both of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/212,310

(22) Filed: Dec. 16, 1998

(30) Foreign Application Priority Data

Jul. 10, 1998 (JP) .............................. 10-195409

(51) Int. Cl.[7] ................................. G11C 7/00
(52) U.S. Cl. ............. 365/201; 365/230.03; 365/230.06
(58) Field of Search .................... 365/201, 230.03, 365/230.06, 189.01, 230.01

(56) References Cited

U.S. PATENT DOCUMENTS 5,276,647 A * 1/1994 Matsui et al. ............... 365/201
5,986,917 A * 11/1999 Lee .............................. 365/201
6,026,038 A * 2/2000 Cho et al. .................... 365/201
6,115,319 A * 9/2000 Kinoshita et al. ........... 365/233

OTHER PUBLICATIONS

"Wafer Burn-in (WBI) Technology for High Density DRAM", Hiroyuki Noji, et al., Technical Reprot of IEICE, SDM94-22, ICD94-33 (1994-05) pp. 41-46.

* cited by examiner

Primary Examiner—David Nelms
Assistant Examiner—Hoai V. Ho
(74) Attorney, Agent, or Firm—McDermott, Will & Emery

(57) ABSTRACT

A semiconductor storage device having a line-to-line burn-in function of main word lines, applying a stress voltage between the main word lines in a wafer burn-in state. In a wafer burn-in state, by a control circuit means, main word lines are divided to odd-numbered lines and even-numbered lines to be connected to an odd-numbered pad and an even-numbered pad respectively, and a stress voltage is applied directly between the odd-numbered pad and the even-numbered pad. By a row decoder being capable of control in both of an ordinary operation mode and a wafer burn-in operation mode, in a wafer burn-in state, main word lines are divided to odd-numbered lines and even-numbered lines to become selective state, and a stress voltage is applied between main word lines.

11 Claims, 12 Drawing Sheets

SEMICONDUCTOR STORAGE DEVICE HAVING BURN-IN MODE

BACKGROUND OF THE INVENTION

1. Field of the Invention

The present invention relates to a semiconductor storage device and, more specifically, to a semiconductor storage device (hereinafter referred to as a memory) having a line-to-line burn-in function of main word lines, applying a stress voltage between the main word lines in a burn-in state.

2. Description of Related Art

Techniques relating to a wafer stage burn-in operation on a layered memory having main word lines and sub-word lines (also called a double word line structure or divisional word line structure memory) are disclosed in, for instance, Japanese Patent Application Laid-Open Nos. 9-63273, 8-55497, and 9-17199. However, these publications are directed to a case of applying a burn-in stress voltage to sub-word lines en bloc, and do not disclose any technique of applying a stress voltage between main word lines.

The wiring pitch of layered word lines is increasingly decreased as the integration density increases. For example, at present, the line-to-line pitch of main word lines of DRAMs is smaller than 1 μm and even latent insulation defects are no longer negligible. Therefore, it is now strongly desired to provide a memory that can be subjected to a line-to-line burn-in operation for main word lines, particularly a wafer burn-in operation (hereinafter abbreviated as WBI).

SUMMARY OF THE INVENTION

The present invention has been made to solve the above problems in the art, and a first object of the invention is therefore to provide a semiconductor storage device in which WBI high-voltage stress can be applied between main word lines.

A second object of the invention is to provide a semiconductor storage device which enables chip size reduction by avoiding use of electrode pads dedicated to WBI that occupy a relatively large area and which allows WBI to be performed even in a resin-sealed package state.

A third object of the invention is to provide a semiconductor storage device which enables a long-pulse, long-cycle WBI operation, because a defect of insulation between main word lines has a very high insulation resistance value and hence in many cases a WBI operation using a short-pulse voltage cannot provide sufficiently high WBI effect.

According to a first aspect of the present invention, there is provided a semiconductor storage device comprising a cell array having a plurality of memory cells that are arranged in matrix form; a plurality of sub-word lines to serve as signal lines for selection in each row of the cell array; a plurality of main word lines to serve as signal lines for collective selection of a plurality of rows of the cell array via plural ones of the sub-word lines; a row decoder for generating a row selection signal for the main word lines and a row selection signal for the sub-word lines by decoding an address signal that is input externally; mutual switching means for switching among operation modes that includes an ordinary operation mode, a waiting mode, and a burn-in mode; and line-to-line burn-in means of the main word lines for applying a burn-in stress voltage between the main word lines in the burn-in mode.

In the semiconductor storage device, the semiconductor storage device may be of a wafer-like one, and the line-to-line burn-in means may apply a wafer burn-in stress voltage that is responsive to a stress application start signal between adjacent ones of the main word lines in a wafer burn-in state.

Here, the semiconductor storage device may be of a wafer-like one, the semiconductor storage device may further comprise an electrode pad to which a stress voltage is input externally; wiring means for supplying the stress voltage to every other one of the main word lines; stress application start signal generating means for generating a stress application start signal when the stress voltage is applied to the electrode pad; and control means of a line-to-line voltage between the main word lines for supplying the stress voltage to every other one of the main word lines in response to the stress application start signal after separating the row decoder from the main word lines.

Here, the semiconductor storage device may be of a wafer-like one, the semiconductor storage device may further comprise an electrode pad to which a stress voltage is input externally; wiring means for supplying the stress voltage from the electrode pad to every other one of the main word lines; wafer burn-in mode judgment circuit means for generating a stress application start signal in response to a wafer burn-in mode signal and an address signal that are input externally; and control means of a line-to-line voltage between the main word lines for supplying the stress voltage to every other one of the main word lines in response to the stress application start signal after separating the row decoder from the main word lines.

Here, the semiconductor storage device may be of a wafer-like one, the semiconductor storage device may further comprise wafer burn-in mode judgment circuit means for generating a stress application start signal in response to a wafer burn-in mode signal and an address signal that are input externally, and for generating a stress voltage for every other one of the main word lines; wiring means for supplying the stress voltage that has been generated by the wafer burn-in mode judgment circuit means to every other one of the main word lines; and control means of a line-to-line voltage between the main word lines for supplying the stress voltage to every other one of the main word lines in response to the stress application start signal after separating the row decoder from the main word lines.

Here, the semiconductor storage device may be of a wafer-like one, the semiconductor storage device may further comprise wafer burn-in mode judgment circuit means for generating a stress application start signal in response to a wafer burn-in mode signal and an address signal that are input externally, and for generating a stress voltage for every other one of the main word lines; and control means of a line-to-line voltage between main word lines for supplying the stress voltage to every other one of the main word lines via the row decoder in response to the stress application start signal, the stress voltage being generated for every other one of the main word lines.

In the semiconductor storage device, the semiconductor storage device may be accommodated in a package, and the line-to-line burn-in means of the main word lines may apply a package burn-in stress voltage that is responsive to a burn-in start signal in a package burn-in state between adjacent ones of the main word lines.

In the semiconductor storage device, the semiconductor storage device may be a dynamic random access memory in which a plurality of the main word lines and a plurality of the sub-word lines are formed so as to have a layered word line structure.

In the semiconductor storage device, the burn-in stress voltage may have repetitive voltage pulses having a pulse width that is longer than a clock pulse width of an external row address strobe control signal in the ordinary operation mode.

The above and other objects, effects, features and advantages of the present invention will become more apparent from the following description of the embodiments thereof taken in conjunction with the accompanying drawings.

BRIEF DESCRIPTION OF THE DRAWINGS

FIG. 12 is a main decoder circuit diagram of a semiconductor storage device according to embodiment 4 of the present invention.

FIG. 13 is a timing chart diagram in a case of supplying a line-to-line stress voltage between MWL lines according to embodiment 4 of the present invention.

DETAILED DESCRIPTION OF THE PREFERRED EMBODIMENTS

Figure 1:
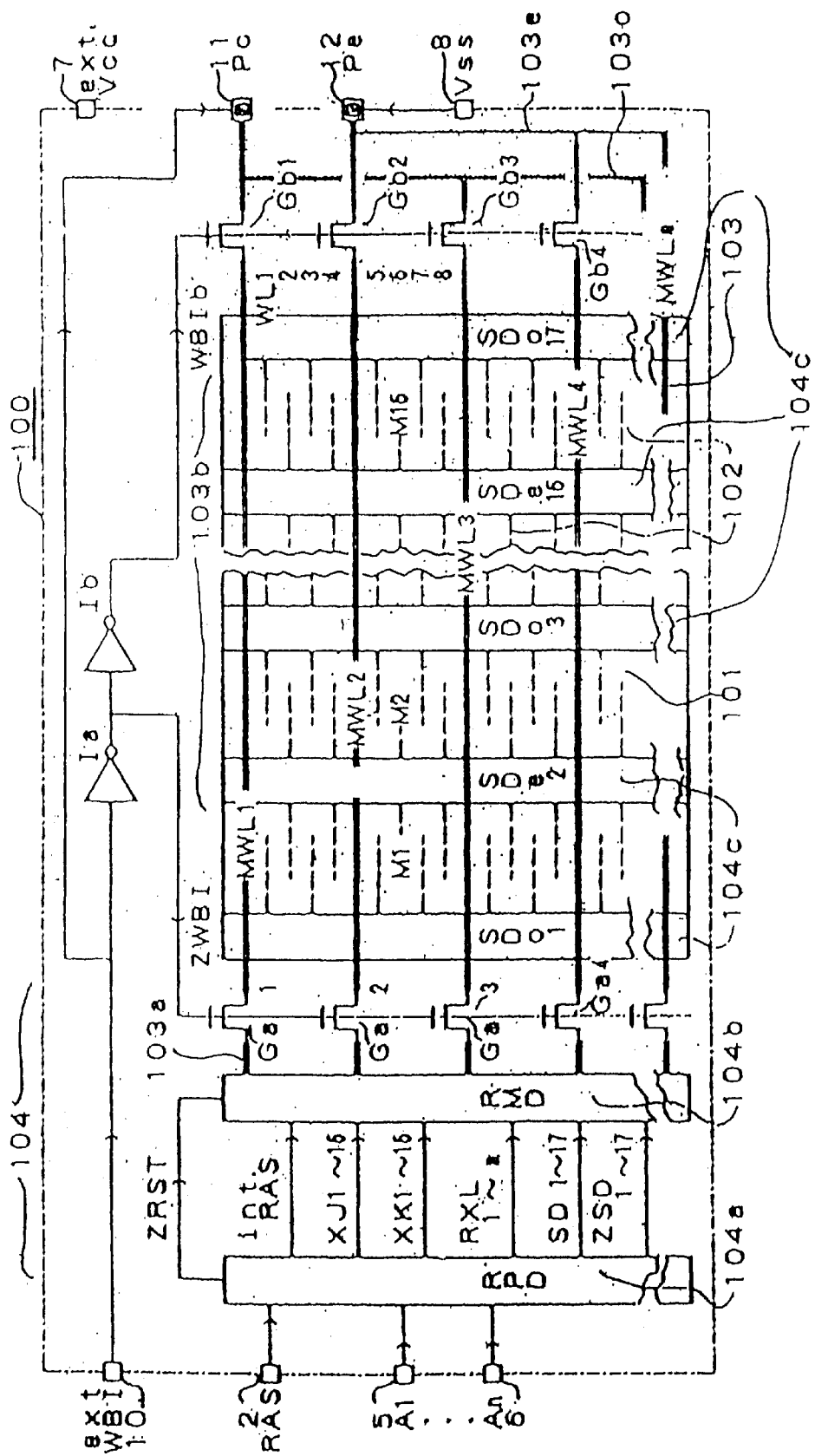
FIG. 1 is a block diagram of a semiconductor storage device according to embodiment 1 the present invention.

Embodiments of the present invention will be described below with reference to the accompanying drawings. It is noted that the same reference symbols in the drawings denote the same or corresponding components.

EMBODIMENT 1

Figure 2:
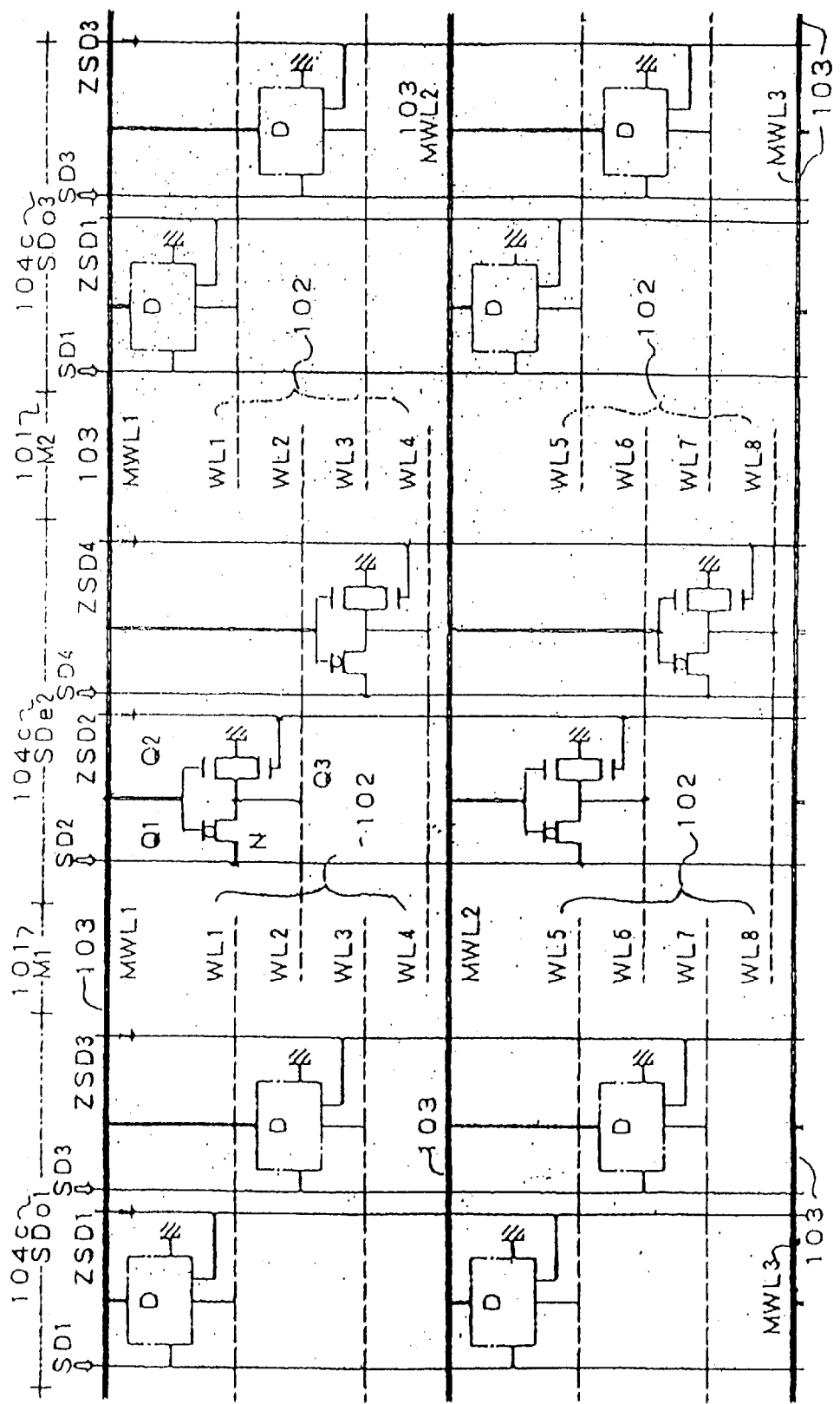
FIG. 2 is a sub-decoder circuit diagram of a semiconductor storage device according to embodiments to 1 to 4 of the present invention.
Figure 3:
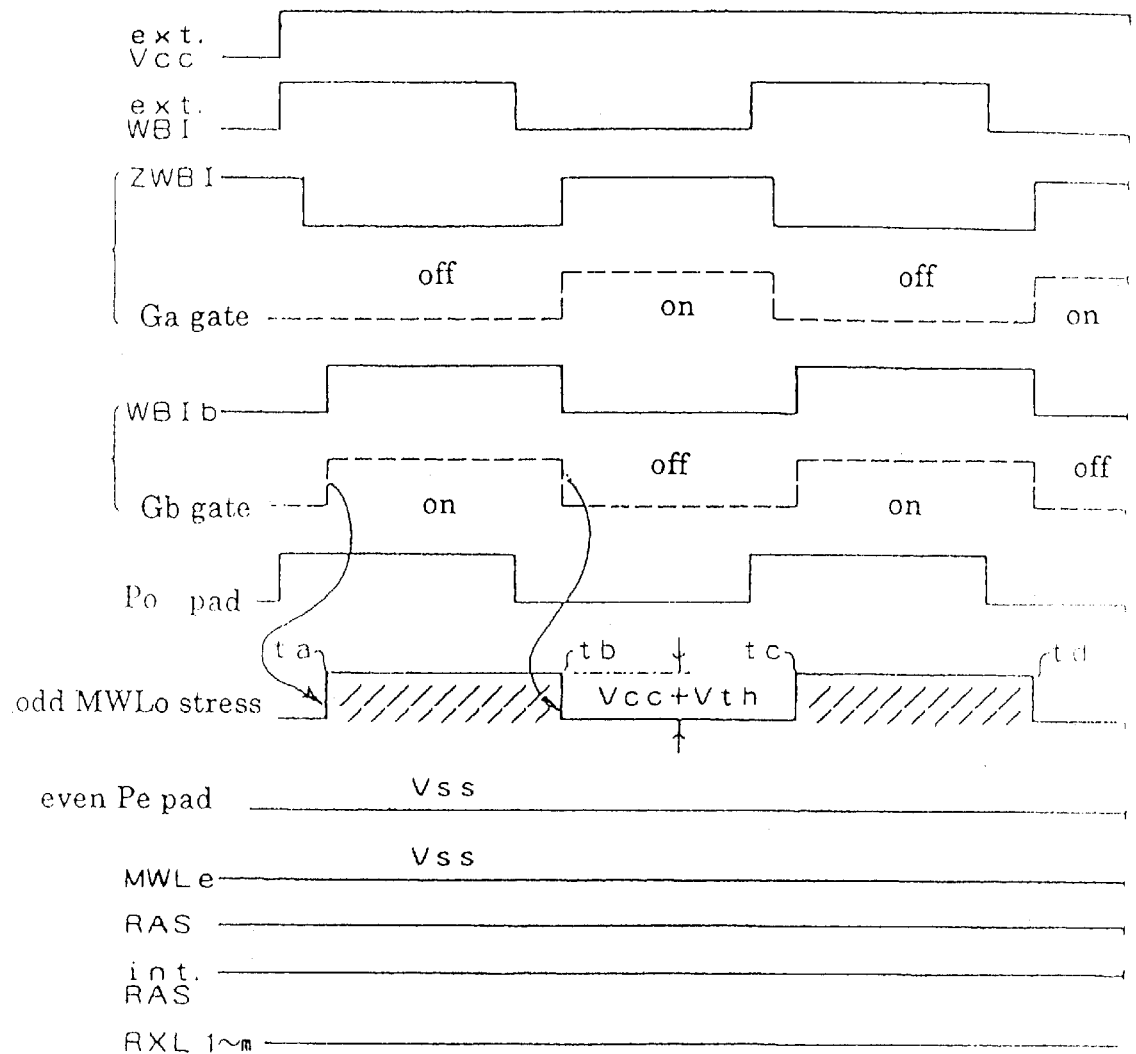
FIG. 3 is a timing chart diagram in a case of supplying a line-to-line stress voltage between MWL lines according to embodiment 1 of the present invention.

FIGS. 1 and 3 are a block diagram of a semiconductor storage device 100 and a timing chart of applying a ling-to-line stress voltage between main word lines in according to embodiment 1 of the invention. FIG. 2 is a circuit diagram of sub-decoders according to embodiments 1 to 4 of the invention.

In FIG. 1, the semiconductor storage device 100 is a wafer-like DRAM having a layered word line structure. The block diagram schematically shows a structure relating to a row selecting operation of the memory having various operation modes that include a waiting state and a burn-in state in addition to an ordinary operation state.

First, the layered word line structure of the memory 100 of FIG. 1 will be described. A cell array 101 that is constituted of memory cells that are arranged in matrix form and sub-word lines 102 as selection lines for one row of the cell array 101 are divided into 16 parts in the row direction. Four sub-word lines (hereinafter frequently written as WLs) 102 corresponding to each of divided cell blocks M1–M16 are commonly selected by one main word line 103. Each main word line (hereinafter frequently written as MWLs) 103 is not divided and is common to the 16 cell blocks. There are m main word lines 103. For example, where the cell array 101 has a storage capacity of 1 MB, m is equal to 128 and hence there are 512 WLs. The WLs are polysilicon layers formed in the first layer on a silicon substrate at a wiring pitch of 0.2 $\mu$m. The MWLs are aluminum layers arranged at a pitch of about 1 $\mu$m in a layer higher than the WLs with an insulating layer interposed in between.

Next, a structure of a row decoder 104 relating to the row selecting operation of the memory 100 will be described with reference to FIG. 1. In an ordinary operation state, an external control signal RAS (row address strobe) that is applied to an electrode pad (hereinafter referred to as a pad) 2 shown in FIG. 1 starts an internal operation of the memory 100 and determines active periods of the internal operation. While the RAS signal is active, component circuits of the row decoder 104 relating to the row selecting operation of the cell array 101, that is, a pre-decoder 104a, a main decoder 104b, and 17 sub-decoders 104c that are disposed on both sides of each of the 16 cell blocks M1–M16, are rendered active.

The pre-decoder (RPD) 104a receives external address signals A1–An that are applied to input pads 5 and 6, and generates an internal control RAS address signal int.RAS, address pre-decode signals XJ and XK, block decode signals RXL (described later in connection with FIG. 5), complementary sub-decode signals SD and ZSD, and a reset signal ZRST by decoding the external address signals A1–An under the control of a control signal generation circuit (not shown).

In a waiting state, the external RAS signal is inactive and hence the pre-decoder 104a does not generate a signal int.RAS, address pre-decode signals XJ and XK, block decode signals RXL, complementary sub-decode signals SD and ZSD, and a reset signal ZRST. Symbol "Z" of ZSD, ZRST, etc. means that the signal is active when it is at a low-level "L."

The main decoder (RMD) 104b is rendered active when receiving address pre-decode signals XJ and XK and block decode signals RXL that are generated by the pre-decoder 104a, and generates main word line signals ZMWL (described again in connection with FIG. 6) for selection and control of a plurality of sub-word lines 102. When receiving a reset signal ZRST during an operation state of selecting between the main word lines 103, the main decoder 104b is rendered in a non-selection state and the memory 100 of FIG. 1 finishes a row selecting operation in an ordinary operation state and is switched to a waiting state.

The sub-decoders 104c are distributed as 17 unit sub-decoders, that is, WL odd-numbered sub-decoders SDo1–SDo17 and WL even-numbered sub-decoders SDe2–SDe16. Each of the unit sub-decoders is controlled by the main decoder (RMD) while receiving complementary sub-decode signals SD and ZSD generated by the pre-decoder 104a, and thereby makes selection among the sub-word lines 102 of the cell blocks M1–M16.

FIG. 2 shows an example circuit including the divided sub-decoders 104c, sub-word lines 102, and cell array 101. As shown in FIG. 2, for example, the first row of the cell array 101 has four sub-word lines 102, that is, WL1–WL4. Among WL1–WL4, the two lines WL2 and WL4 are connected to the WL even-numbered sub-decoder SDe2 (unit sub-decoder), for instance, and the other two lines WL1 and WL3 are connected to the WL odd-numbered sub-decoders SDo1 and SDo3 that are on both sides of the WL even-numbered sub-decoder SDe2. The four sub-word lines 102, WL1–WL4, are connected to the first one MWL1 of the main word lines 103.

For example, selection and control of two pairs of complementary sub-decode signals SD2 and ZSD2, SD4 and ZSD4 that are transmitted to the WL even-numbered sub-decoder SDe2 are made by main word line signals ZMWL1–ZMWL128 on the first one MWL1 to the 128th one MWL128 of the main word lines 103.

As shown in FIG. 2, the unit circuit of each sub-decoder 104c is composed of three transistors whose drains are commonly connected to each other, that is, a p-channel transistor (hereinafter referred to as a pMOS) Q1 and n-channel transistors (hereinafter referred to as nMOSs) Q2 and Q3. The unit circuits corresponding to the WL odd-numbered sub-decoders SDo1 and SDo3 are denoted by symbol D in FIG. 2. The common gates of Q1 and Q2 that constitute a CMOS inverter with their gates commonly connected to each other are connected to the MWL1 main word line 103, whereby a main word line signal ZMWL1 on MWL1 is input to the common gates of Q1 and Q2. A sub-decode signal SD2 is input to the source of Q1 and the source of Q2 is grounded. An inverted signal ZSD2 of the sub-decode signal SD2 is input to the gate of Q3 and the source of Q3 is grounded. A cell selection signal (not given any symbol) is output from a drain common connection terminal N of Q1–Q3 to the WL2 sub-word line 102.

In a waiting state, the above respective signals are not supplied, that is, they are inactive.

Returning to FIG. 1, a description will be made of a line-to-line stress voltage supplying means that applies burn-in stress voltages between the main word lines 103.

The main word lines 103 consists of four portions, that is, MWL portions 103a located on the output side of the main decoder 104b, MWL portions 103b extending across the entire area of the sub-decoders 104c and the cell array 101, a MWL portion 103o for connecting the odd-numbered MWL portions 103b, and a MWL portion 103e for connecting the even-numbered MWL portions 103b. To electrically separate the MWL portions 103a and 103b from each other in applying a stress voltage between adjacent pairs of the MWL portions 103b, 128 separation transfer gates Ga are provided for the respective MWL portions 103b.

To apply a burn-in stress voltage between adjacent ones of the MWL portions 103b after the MWL portions 103a have been separated from the MWL portions 103b, making transfer gates Gb are provided for the respective MWL portions 103b between the MWL portions 103b and the odd-numbered MWL common portion 103o or the even-numbered MWL common portion 103e.

As shown in FIG. 1, a signal ext.WBI that is input to a pad 10 is inverted by an inverter Ia into an inverted signal ZWBI, which is applied to the gates of the 128 respective separation transfer gates Ga. A delayed signal WBIb of the signal ext.WBI is formed by inverters Ia and Ib and applied to the gates of the 128 respective making transfer gates Gb.

As shown in FIG. 1, when the ext.WBI pad 10 as a main word lines line-to-line stress voltage supplying means is directly connected to a Po input pad 11 that is connected to the odd-numbered MWL common portion 103o, a ground potential Vss input pad 8 is directly connected to a Pe input pad 12 that is connected to the even-numbered MWL common portion 103e. When the ext.WBI pad 10 is connected to the Pe input pad 12, the Vss input pad 8 is connected to the Po input pad 11.

All the input pads 2–12 shown in FIG. 1 are provided in a memory chip area of the memory 100 so that the memory 100 can be subjected to a burn-in operation at both of a wafer stage and a package stage.

In a state that the wafer-like memory 100 is mounted on a burn-in board, a burn-in operation is started in such a manner that the memory 100 is supplied with an external power supply voltage ext.Vcc, a ground potential Vss, and a signal voltage ext.WBI from a prober of a burn-in tester in a high-temperature furnace of 80°–120° C., for instance. Usually, various operations that are a combination of basic operations (data reading, data writing, refreshing, etc.) and special operations of a DRAM memory or a single operation is performed continuously for several hours or a little more than 10 hours. By performing a burn-in operation at a wafer stage, a higher debugging effect can be obtained than at a package stage, enabling defective products to be saved by using a redundancy technique.

For a rated voltage ext.Vcc=5 V of the memory 100 in an ordinary operation state, the ext.WBI voltage as a stress voltage is set at 6 V or more. The ext.WBI voltage is set by adding a voltage drop (about 1 V) that corresponds to a transistor threshold voltage Vth of each of the making transfer gates Gb. The ext.WBI voltage is repetitive long pulses having a clock period of about tens of milliseconds to about 0.1 second. Stress due to the repetitive long pulses accelerates growth of a latent insulation defect between main word lines, to thereby make it appear as an actual defect in a short time.

FIG. 3 is a timing chart in a case of supplying a line-to-line stress voltage between main word lines to the wafer-like memory 100 that is in a waiting state and is placed in a high-temperature furnace.

A first clock pulse potential of the ext.WBI voltage directly appears at the odd-numbered MWL pad Po 12 and a ground potential Vss directly appears at the even-numbered MWL pad Pe 11. After the separation transfer gates Ga are turned off and the making transfer gates Gb are turned on, the potential of M for odd-numbered MWLs rises, whereby a stress voltage (Vcc+Vth)=6 V between each pair of even-numbered and odd-numbered MWLs is applied in a period ta to tb for a first pulse and in a period tc to td for a second pulse (see FIG. 3). In a waiting state, since the external RAS signal, the internal RAS signal, and the signals RXL1, . . . , RXLi, . . . ,RXLm have a logic level "L" that means non-selection, no main word line signals ZMWL are output from the main decoder 104b.

Next, modifications to the embodiment 1 will be described.

(a) The separation transfer gates Ga may be formed inside the main decoder 104b or directly connected to output ends of the main decoder 104b by removing the MWL portions 103a of the main word lines 103 (see FIG. 1).

(b) When a transition is made from a waiting state in which the main decoder 104b is in a non-selection state to a burn-in state, the separation transfer gates Ga may be removed.

(c) When a burn-in operation is performed in only a wafer stage and need not be performed in a later package stage, the memory 100 can be miniaturized by forming all the input pads that are dedicated to a burn-in stress voltage to be applied between the main word lines in a dicing area that is outside the main chip area of the memory 100.

(d) The manner of dividing the layered word lines and the row decoder is not limited to the case of FIGS. 1 and 2, and other structures and schemes may be employed.

(e) Although the embodiment 1 is directed to the case of a layered word line type DRAM, the invention is not limited to such a case and can also be applied to other types of RAMs such as an SRAM, or ROMs having main word lines in the form of layered word lines.

As described above, the memory 100 (see FIG. 1) according to the embodiment 1 of the invention is provided with a) a plurality of pads (external stress voltage pad 10, Po pad 11, Pe pad 12, and grounding pad 8) for direct input of an external stress voltage; b) wiring means 103o and 103e for supplying a stress voltage to every other main word line 103, that is, to the odd-numbered ones or the even-numbered ones; c) a stress application start signal generating means (inverters Ia and Ib) for generating a stress application start signal ZWBI when a stress voltage is applied to the pad 10; d) a control means of a line-to-line voltage between main word lines for applying the stress voltage ext.WBI to every other MWL portion 103b via the making transfer gates Gb after separating the main decoder 104b from the MWL portions 103b with the separation transfer gates Ga in response to the stress application start signal ZWBI. Therefore, a wafer stage burn-in operation can be performed that is superior in a debugging effect for an insulation defect that may latently exist between the main word lines.

EMBODIMENT 2

Figure 4:
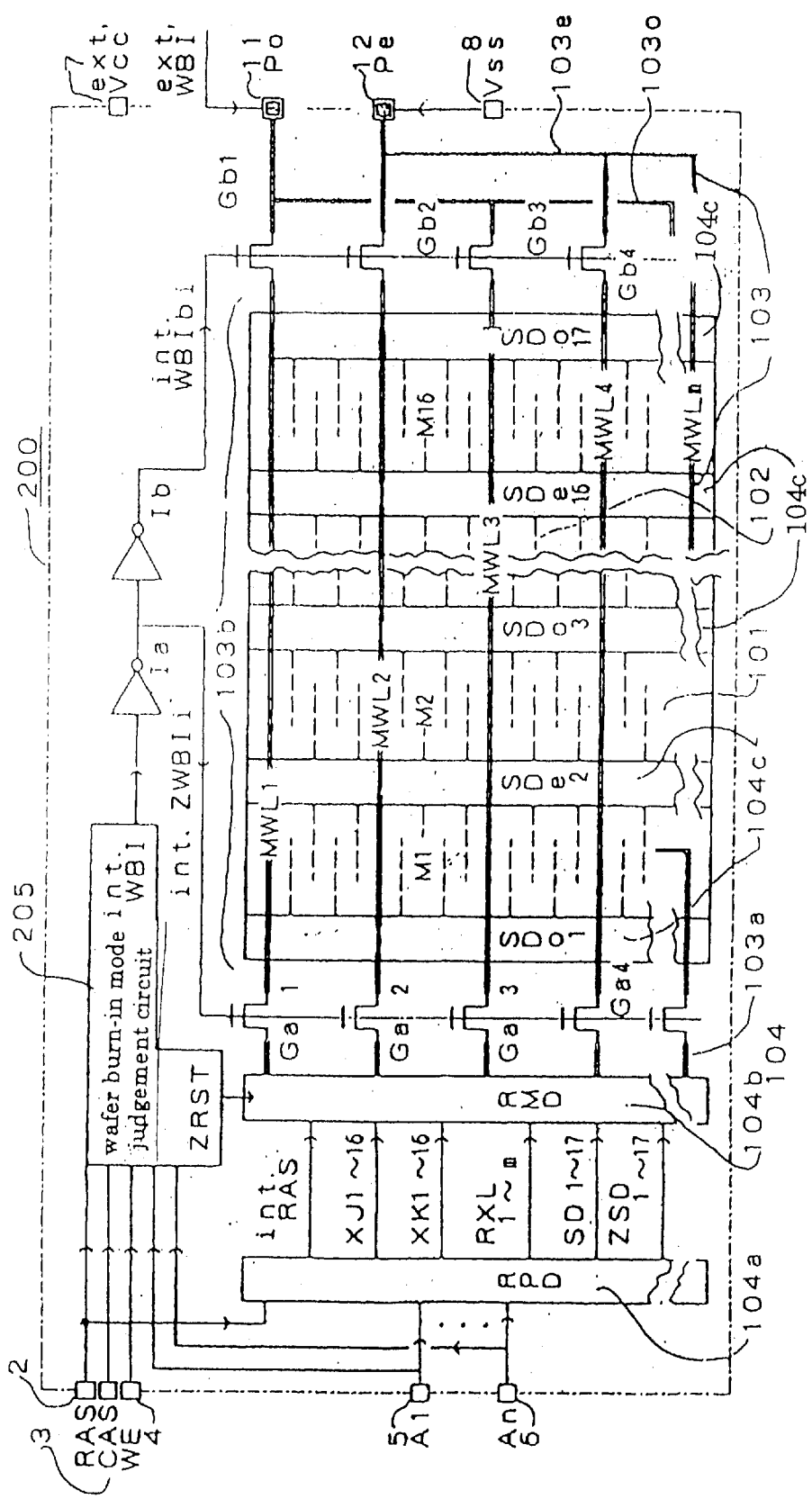
FIG. 4 is a block diagram of a semiconductor storage device according to embodiment 2 of the present invention.
Figure 5:
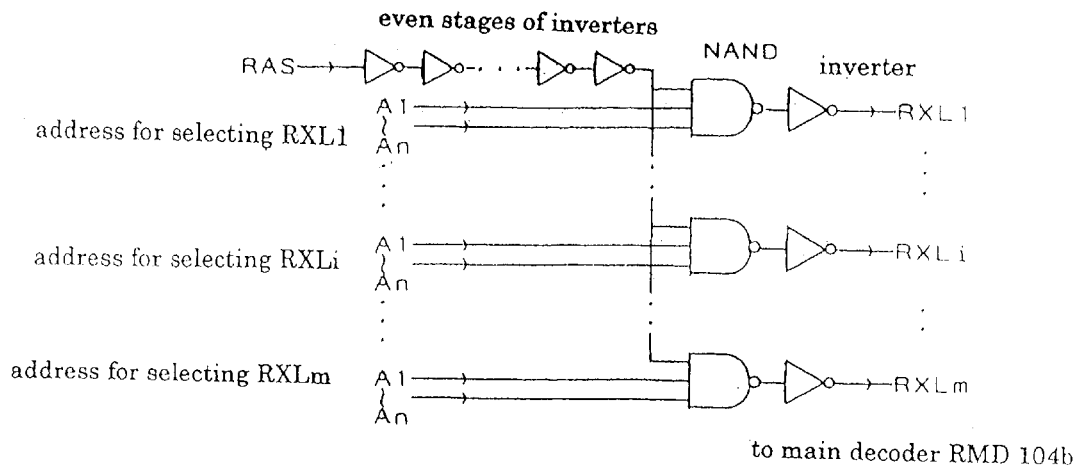
FIG. 5 is a pre-decoder circuit diagram of a semiconductor storage device according to embodiments 1 to 4 of the present invention.
Figure 6:
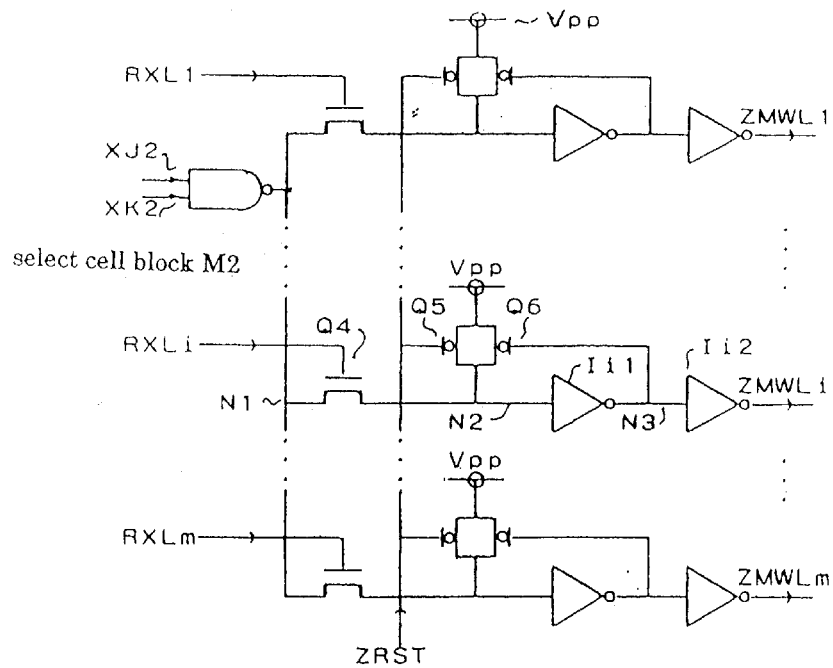
FIG. 6 is a main decoder circuit diagram of a semiconductor storage device according to embodiments 1 to 3 of the present invention.
Figure 7:
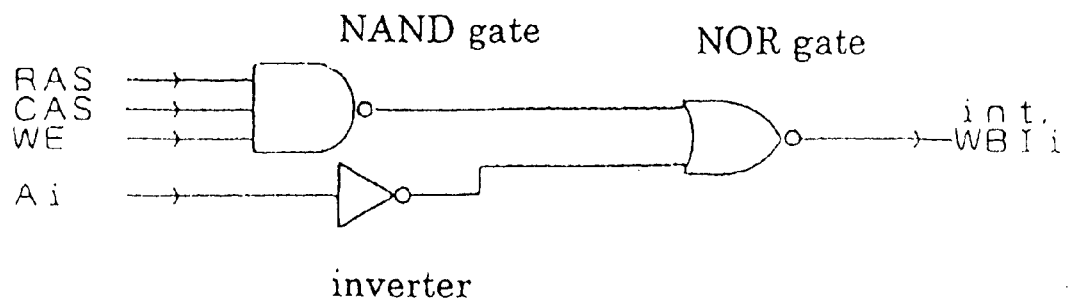
FIGS. 7A and 7B are WBI mode judgement circuit diagrams of a semiconductor storage device according to embodiments 2 to 4 of the present invention.
Figure 7:
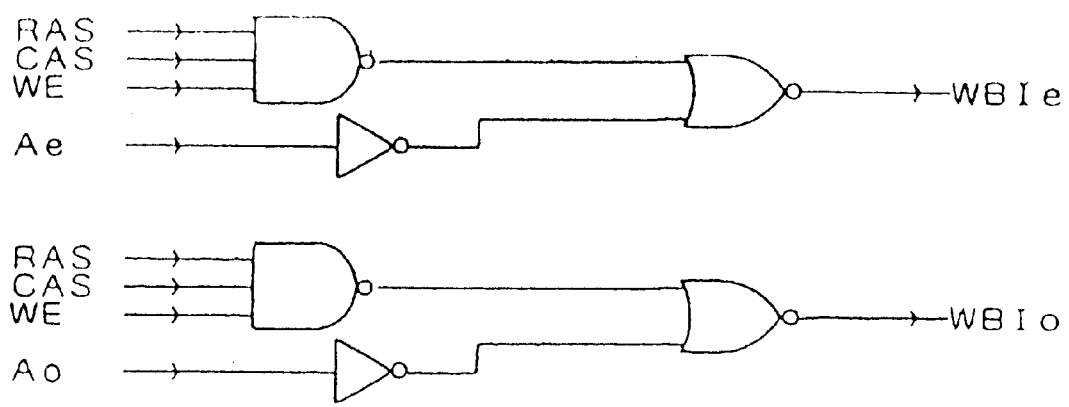
Figure 8:
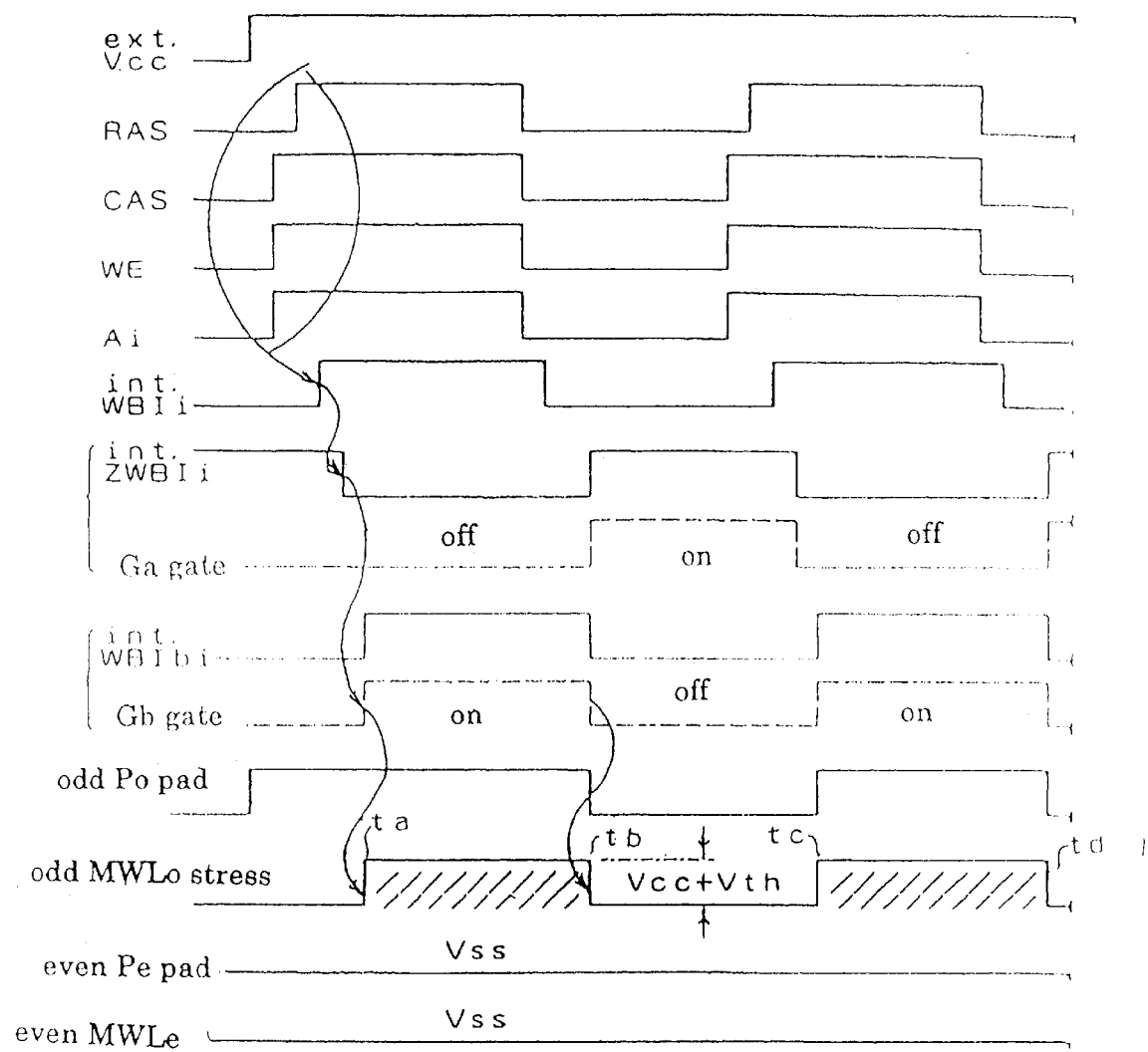
FIG. 8 is a timing chart diagram in a case of supplying a line-to-line stress voltage between MWL lines according to embodiment 2 of the present invention.

FIGS. 4 and 8 are a block diagram and a timing chart of application of a line-to-line stress voltage between main word lines in a semiconductor storage device 200 according to embodiment 2 of the invention. FIGS. 7A and 7B show examples of WBI mode judgment circuits according to embodiments 2 to 4 of the invention. FIGS. 5 and 6 show circuit examples of a pre-decoder and a main decoder, respectively, according to embodiments 1 to 3 of the invention. Components in the above figures having the same or corresponding components in FIGS. 1–3 are given the same reference symbols as in FIGS. 1–3 and will not be described.

In the memory 100 according to the embodiment 1, when a transition is made from a waiting state to a WBI state, it is inevitable that a start of applying a stress voltage between the main word lines is not timed with external signals RAS, CAS (Column Address Strobe), and WE (Write Enable) because the WBI start time does not depend on an external RAS signal nor an internal RAS signal.

As shown in FIG. 4, the memory 200 according to the embodiment 2 is additionally provided with a WBI mode judgment circuit 205 which generates an internal WBI start signal that is timed with input of an external RAS signal after a true/false judgment has been performed on externally input burn-in mode signals to produce a judgment result to the effect that they are correct. As a result, even when a transition is made from a waiting state to a WBI state, a start of applying a stress voltage between the main word lines is timed with external signals RAS, CAS, and WE.

Further, in the memory 200, the input pad 10 of the memory 100 of FIG. 1 is removed and a WBI (wafer burn-in) stress voltage that is supplied from an external power supply is directly supplied to the Po input pad 11.

FIG. 5 shows an example circuit of a block decode signal RXL generation circuit of the pre-decoder 104a. As shown in FIG. 5, the block decode signal RXL generation circuit is composed of m stages of unit decoding circuit sections where m is equal to the number of main word lines (MWL) 103. The unit decoding circuit section for an ith MWL is composed of a multiple-input NAND gate that receives a signal obtained by delaying, with an even number of inverters, an external control signal RAS that is applied to the input pad 2 and a combination signal of external addresses A1–An that is applied the input pads 5 and 6, and an inverter for inverting an output of the multiple-input NAND gate. The a combination signal of Al–An is set to an address of the ith MWL to be selected, and is input to the input terminal of the main decoder 104b for the ith MWL (see FIG. 1 or FIG. 4) from the output terminal of the inverter. Respective circuits in the pre-decoder 104a for generating address pre-decode signals XJi (i=1 . . . 16) and XKi (i=1 . . . 16) and sub-decode signals SDk (k=1 . . . 17) are also composed of multiple-input NAND circuits and inverters. Since those circuits are similar to the circuit of FIG. 5, they are not illustrated.

An example circuit of the main decoder 104b will be described below with reference to FIG. 6. The circuit shown in FIG. 6 is composed of m stages of unit decoding circuit sections where m is equal to the number of main word lines 103. The output terminal of an input-stage NAND gate that receives address pre-decode signals XJi and XKi for setting an address of a cell block to be selected serves as a common input terminal N1 of the m-stage unit decoding circuit sections.

As shown in FIG. 6, the unit decoding circuit section for an ith main word line is composed of an nMOS transistor Q4 that is turned on/off receiving a block decode signal RXLi at its gate, a series circuit section that is a two-stage cascade connection of inverters Ii1 and Ii2, a latch circuit section in which the potential of an output terminal N3 of the inverter Ii1 is fed back to the gate of a pMOS transistor Q6, and a pMOS transistor Q5 that receives a reset signal ZRST. The unit decoding circuit section for the ith main word line is activated when the potential of the output terminal N3 of the inverter Ii1 is "H," and an inverted signal ZMWLi of that potential is output from the inverter Ii2. Symbol "Z" means that that the signal is active when it is at a logic level "L." When a common reset signal ZRST that is active if its logic level is "L" is input, the pMOS transistor Q5 is turned on and the potential of the connection terminal N2 is fixed at a high voltage Vpp (pull-up state), whereby a main word line signal ZMWL is reset to a non-selection state.

FIGS. 7A and 7B show example circuits of the WBI mode judgment circuit 205. The proper time point of starting a burn-in mode in the DRAM memory 200 is preset at, for instance, a time point when both of a CAS signal and a WE signal are input before a RAS signal. An address Ai of a main word line 103 to be selected approximately at the same time point. After it has been judged that a correct burn-in mode has been entered by confirming coincidence between the two input time points, the example circuits generate an internal WBI signal so that it is timed with input of an external RAS signal.

In the WBI mode judgment circuit 205 of FIG. 7A, a NOR circuit generates an internal wafer burn-in start signal int.WBI by NORing an output of a NAND gate that receives external control signals RAS, CAS, and WE from the respective input pads 2–4 and an output of an inverter that receives a WBI setting address signal Ai from the input pads 5 and 6. The int.WBI signal is used to control the on/off timing of the separation transfer gates Ga and the making transfer gates Gb.

The WBI mode judgment circuit of FIG. 7B is intended for a case of setting WBI for only the even-numbered or odd-numbered main word lines MWLs. When it is desired to set WBI for only the even-numbered main word lines, an external address signal Ai is changed to an even-numbered address Ae. When it is desired to set WBI for only the odd-numbered main word lines, an odd-numbered address Ao is input. In this manner, two kinds of internal WBI start signals int.WBIe and int.WBIo are generated, which are used in embodiment 3 as a WBI start signal and a stress voltage to be applied between the main word lines.

FIG. 8 is a timing chart in a case where application of a main word lines line-to-line stress voltage is started by the WBI mode judgment circuit 205 of FIG. 7A.

Since in a waiting state the main decoder 104b of the memory 200 is rendered in a non-selection state and a stress voltage ext.WBI is directly applied to the Po pad 11, as in the case of FIG. 3 a first pulse of a main word lines line-to-line stress voltage appears at the pad Po for the odd-numbered MWLs and a ground potential Vss appears at the pad Pe for the odd-numbered MWLs at a time point when an ext.Vcc potential has been established.

After the establishment of the ext.Vcc potential, a mode signal true/false judgment is performed at a time point when both of CAS and WE signals are input before a RAS signal or a WBI setting address Ai is input. Since the ext.WBI signal is directly applied to the Po pad 11, a WBI setting address Ai (for an ith main word line MWLi) needs to be an odd number. In response to a judgment that Ai is an odd number, an internal wafer burn-in signal int.WBIi rises as indicated by an arrow in FIG. 8.

After the separation transfer gates Ga are turned off by an int.ZWBIi signal that is an inverted version of the int.WBIi signal, the making transfer gates Gb are turned on by an int.WBIbi that is a delayed version of the int.WBIi signal. In response to the turn-on of the gates Gb, the potential of the portions 103b of the odd-numbered main word lines MWLo that are connected to the Po pad 11 rises.

Therefore, a potential difference between the potential of the portions 103b of the odd-numbered main word lines MWLo and the potential of the portions 103b of the even-numbered main word lines MWLe that becomes a ground potential Vss after the making transfer gates Gb have been turned on becomes a line-to-line stress voltage between main word lines and is applied between each pair of odd-numbered and even-numbered main word lines that are adjacent to each other. Since the potential of the odd-numbered main word lines MWLo becomes a "H" level in a period of ta to tb for a first pulse and in a period of tc to td for a second pulse as shown in FIG. 8, a line-to-line stress voltage (Vcc+Vth)=6 V is applied between each pair of odd-numbered and even-numbered MWLs only in those periods.

As described above, the memory 200 (see FIG. 4) according to the embodiment 2 of the invention is provided with the Po electrode pad 11 and the Pe electrode pad 12 to which a stress voltage ext.WBI is input externally; wiring means 103o and 103e for supplying the stress voltage from the Po or Pe electrode pad to every other MWL portion 103b; a wafer burn-in mode judgment circuit means 205 for generating a stress application start signal int.ZWBIi in response to external wafer burn-in mode signals RAS, CAS, and WE that are input from the respective pads 2–4 and address signals A1–An that are input from the input pads 5–6; and a control means of a line-to-line voltage between main word lines for applying the stress voltage to every other main word line portion 103b after separating the main decoder 104b from the main word line portions 103b in response to the stress application start signal. As a result, a main word lines line-to-line stress voltage can be applied with correct timing.

EMBODIMENT 3

Figure 9:
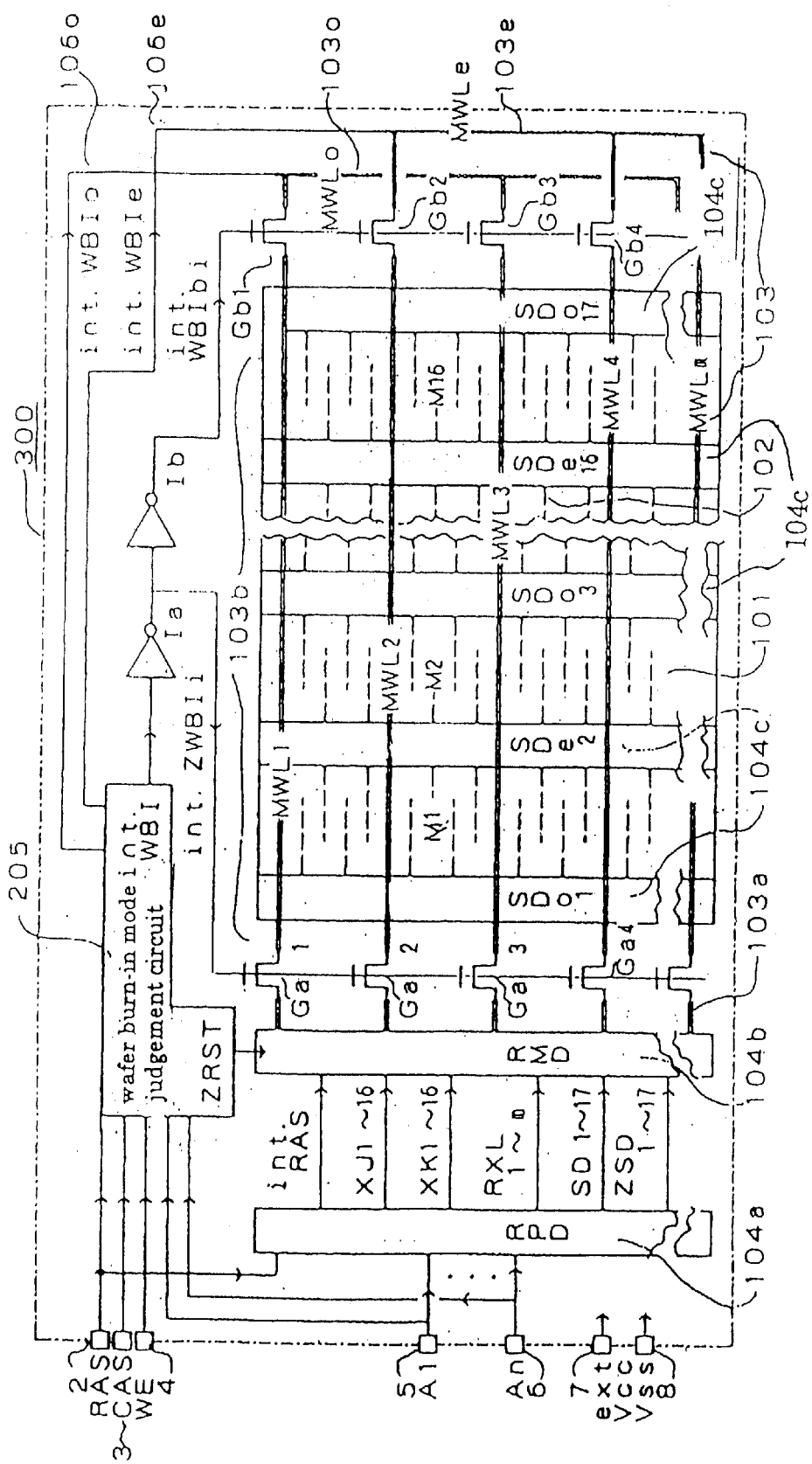
FIG. 9 is a block diagram of a semiconductor storage device according to embodiment 3 of the present invention.
Figure 10:
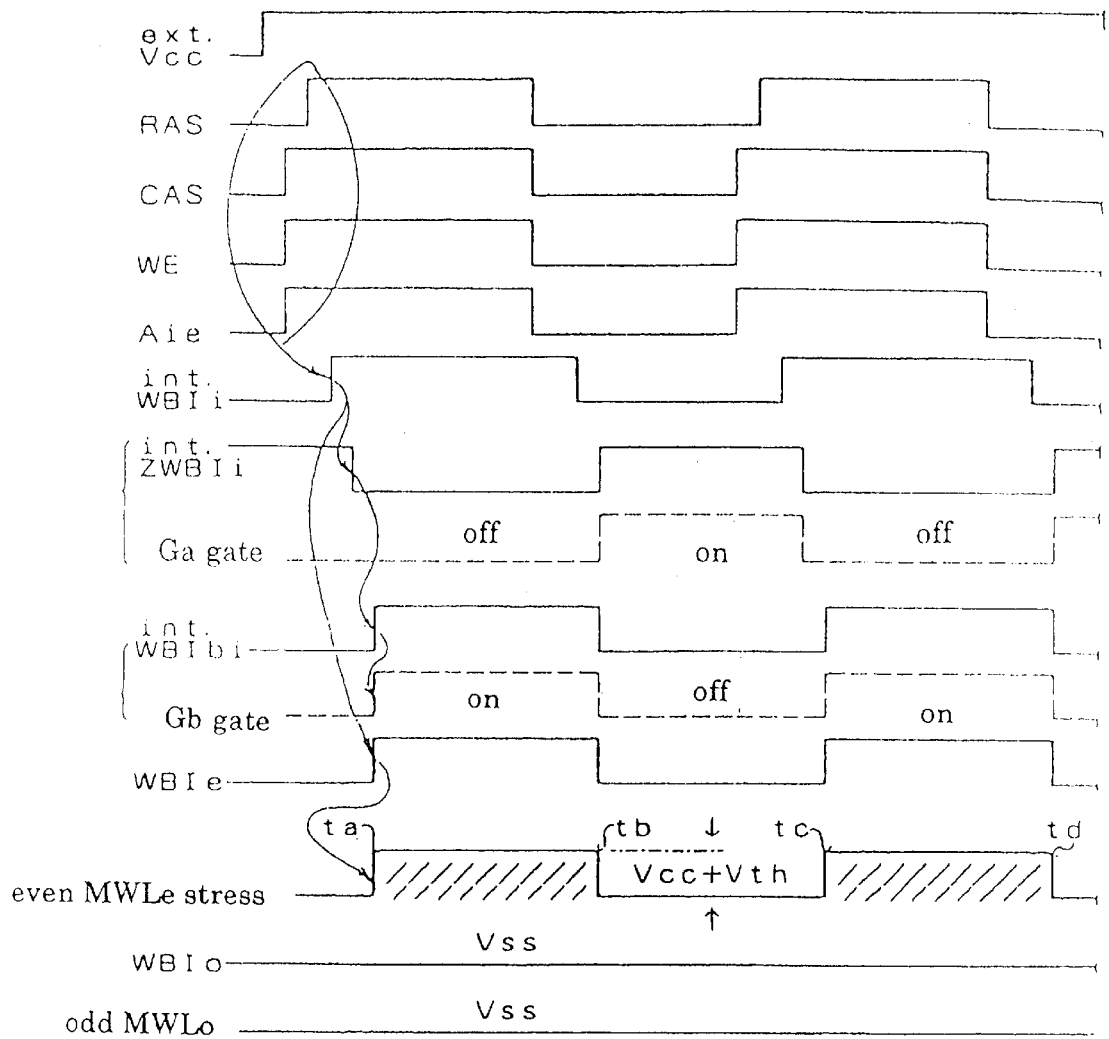
FIG. 10 is a timing chart diagram in a case of supplying a line-to-line stress voltage between MWL lines according to embodiment 3 of the present invention.

FIGS. 9 and 10 are a block diagram and a timing chart of application of a line-to-line stress voltage between main word lines in a semiconductor storage device 300 according to embodiment 3 of the invention. This embodiment uses the pre-decoder 104a shown in FIG. 5, the main decoder 104b shown in FIG. 6, the sub-decoder 104c shown in FIG. 2, and the WBI mode judgment circuits 205 shown in FIGS. 7A and 7B. Components in the embodiment 3having corresponding components in the first and embodiment 2s are given the same reference symbols as in the first and embodiment 2s and will not be described.

First, referring to FIG. 9, in the memory 300 according to the embodiment 3, the WBI mode judgment circuit 205 performs a true/false judgment on mode signals that are input externally and generates four kinds of internal burn-in signals (described below) in accordance with the input timing of an external RAS signal after making a judgment that the mode signals are correct.

The first internal signal is an internal WBI signal int.WBIi that is generated from the circuit of FIG. 7A when a WBI setting address signal Ai is input to the above WBI mode judgment circuits 205. The int.WBIi signal is inverted into a signal int.ZWBIi, which serves as an off start signal for the separation transfer gates Ga.

As for the second internal signal, the int.ZWBIi is delayed to become a signal int.WBIbi, which serves as an on start signal for the making transfer gates Gb.

The third internal signal is an internal WBI signal int.W-BIe that is generated from the circuit of FIG. 7B when it receives an even-numbered MWL WBI setting address Ae to the above WBI mode judgment circuits 205, and serves as an internal WBI stress voltage for the even-numbered MWLs.

The fourth internal signal is an internal WBI signal int.WBIo that is generated from the circuit of FIG. 7B when it receives an odd-numbered MWL WBI setting address Ao to the above WBI mode judgment circuits 205, and serves as an internal WBI stress voltage for the odd-numbered MWLs.

Thus, the memory 300 has an advantage that it does not require any external power supply for supplying a WBI stress voltage because it incorporates the circuit for internally generating WBI start signals and the power supply for applying a WBI stress voltage between main word lines.

An internal wafer burn-in signal WBIe for even-numbered MWLs is supplied to the even-numbered MWL common portion 103e via a WBIe signal line 106e. On the other hand, an internal wafer burn-in signal WBIo for odd-numbered MWLs is supplied to the odd-numbered MWL common portion 103o via a WBIo signal line 106o.

In FIG. 9, the Pe input pad 12 connected to the even-numbered MWL common portion 103e and the Po input pad 11 connected to the odd-numbered MWL common portion 103o that are provided in FIGS. 1 and 4 are omitted.

FIG. 10 is a timing chart in a case where a transition is made from a waiting state to a WBI state in the wafer-like memory 300 in which the internal circuit generates timing signals for staring application of a stress voltage between the main word lines.

Since WBI is started from a waiting state, the main decoder 104b of the memory 300 is rendered in a non-selection state. FIG. 10 shows a case where the WBI mode judgment circuit 205 receives a WBI setting address Ai and an even-numbered MWL WBI setting address Ae but does not receive an odd-numbered MWL WBI setting address Ao.

After establishment of an ext.Vcc potential, a WBI mode signal true/false judgment is performed at a time point when both of CAS and WE signals are input before a RAS signal or a WBI setting address Ai (for an ith main word line MWLi) is input. After a judgment that WBI mode signals are correct, an internal wafer burn-in signal int.WBIi rises in response to input of an external RAS signal as indicated by an arrow in FIG. 10. After the separation transfer gates Ga are turned off by an int.ZWBIi signal that is an inverted version of an int.WBIi signal, the making transfer gates Gb are turned on by an int.WBIbi signal that is a delayed version of the int.WBIi. In response to the turn-on of the gates Gb, the potential of the MWL portions 103b (extending across the entire area of the cell array 101 and the sub-decoders 104c; see FIG. 9) of the even-numbered main word lines MWLe rises.

On the other hand, since no odd-numbered MWL WBI setting address Ao is input, the potential of the portions 103b of the odd-numbered main word lines MWLo does not rise, that is, is kept at the "L" level of an int.WBIo signal.

Therefore, a potential difference between the potential of the portion 103b of the even-numbered main word lines MWLe and the potential of the portion 103b of the odd-numbered main word lines MWLo that remains a ground potential VSS even if the making transfer gates Gb have been turned on because they have not been selected by any internal WBI signal is applied, as a main word lines line-to-line voltage, between the portions 103b of each pair of even-numbered and odd-numbered main word lines that are adjacent to each other.

Since the potential of the even-numbered main word lines MWLe becomes a high level "H" in a period of ta to tb for a first pulse and in a period of tc to td for a second pulse as shown in FIG. 10, a line-to-line stress voltage (Vcc+Vth)=6 V is applied between each pair of odd-numbered and even-numbered MWLs only in those periods.

As described above, the memory 300 (see FIG. 9) according to the embodiment 3 of the invention is provided with a WBI mode judgment circuit means 205 for generating a stress application start signal int.ZWBIi in response to external wafer burn-in mode signals CAS, WE and RAS that are input from the respective pads 2–4 and address signals A1–An that are input from the input pads 5–6 and for generating internal stress voltages int.WBIo and int.WBIe for the odd-numbered MWLS and the even-numbered MWLs, respectively; wiring means 103o and 103e for supplying the internal stress voltages int.WBIo and int.W-BIe to the MWL portions 103b of the odd-numbered MWLS and the even-numbered MWLS, respectively; and a main word lines line-to-line voltage control means for applying the internal stress voltages to every other main word line portion 103b after separating the main decoder 104b from the MWL portions 103b in response to the stress application start signal int.ZWBIi.

In summary, since internal WBI signals are generated in accordance with the input timing of an external RAS signal and the power supply for applying a WBI stress voltage between the main word lines is incorporated in the memory 300, it is not necessary to supply a WBI stress voltage externally and a stress voltage can be applied with improved controllability of the timing with respect to external signals CAS, WE and RAS.

EMBODIMENT 4

Figure 11:
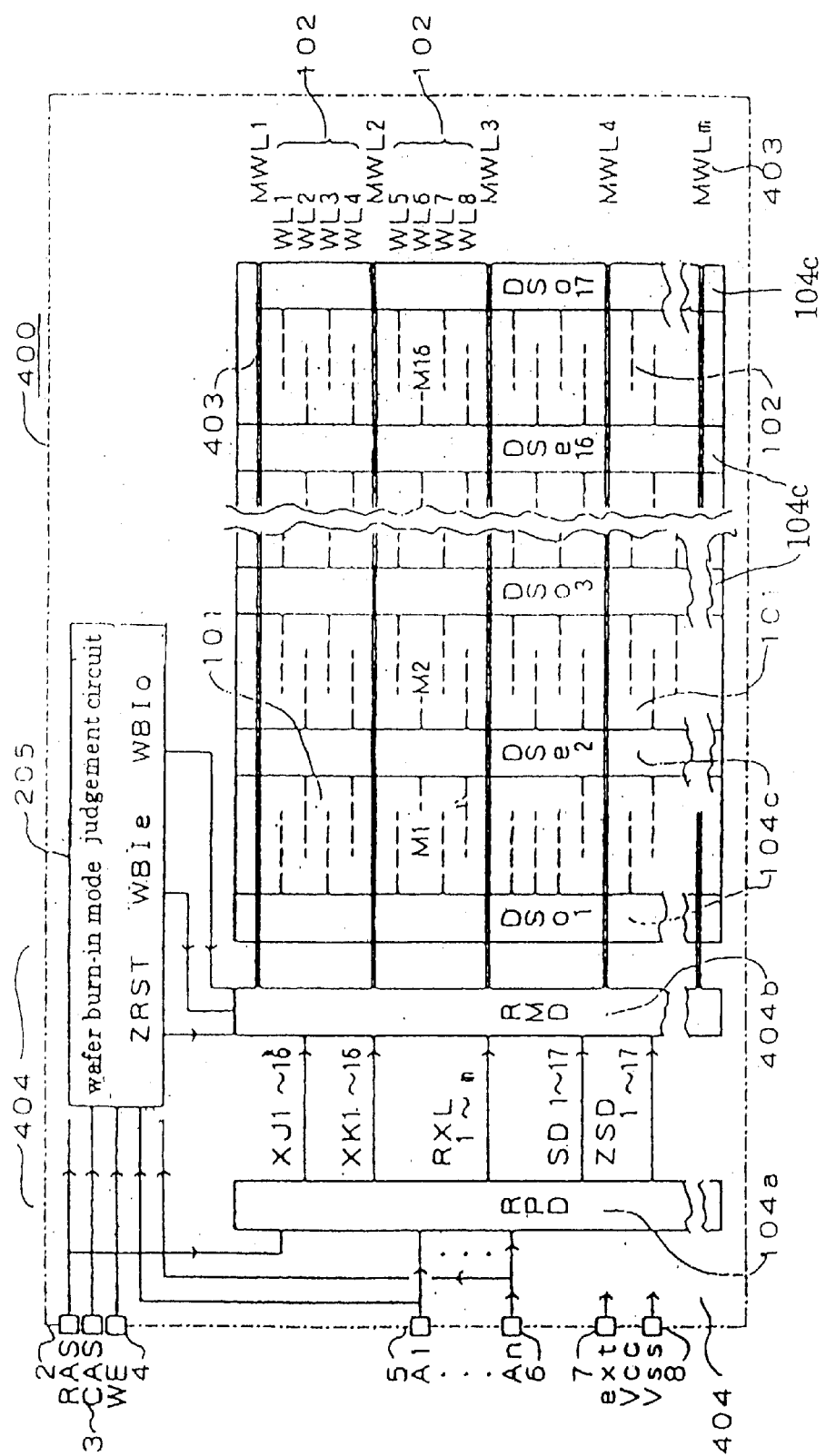
FIG. 11 is a block diagram of a semiconductor storage device according to embodiment 4 of the present invention.
Figure 1:
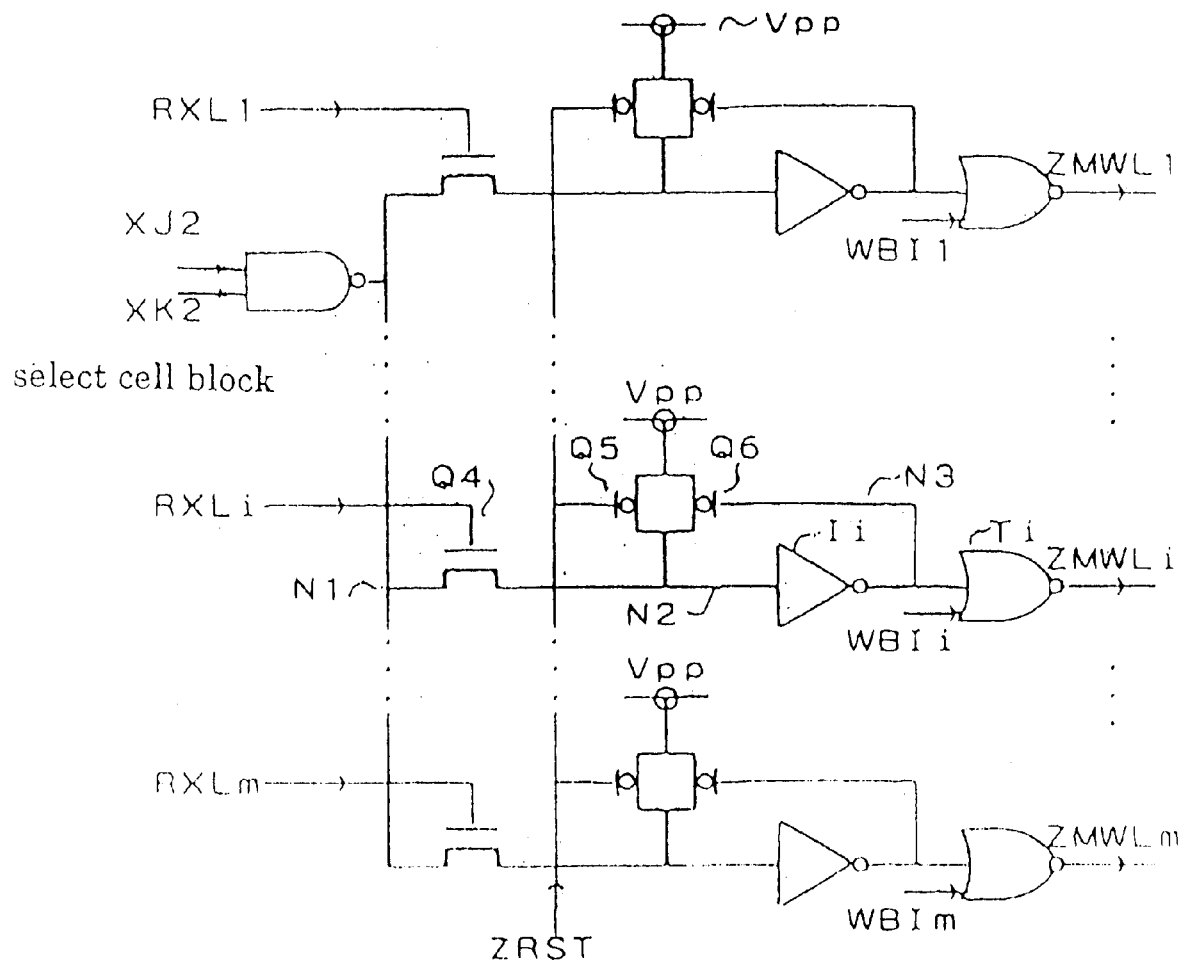
Figure 1:
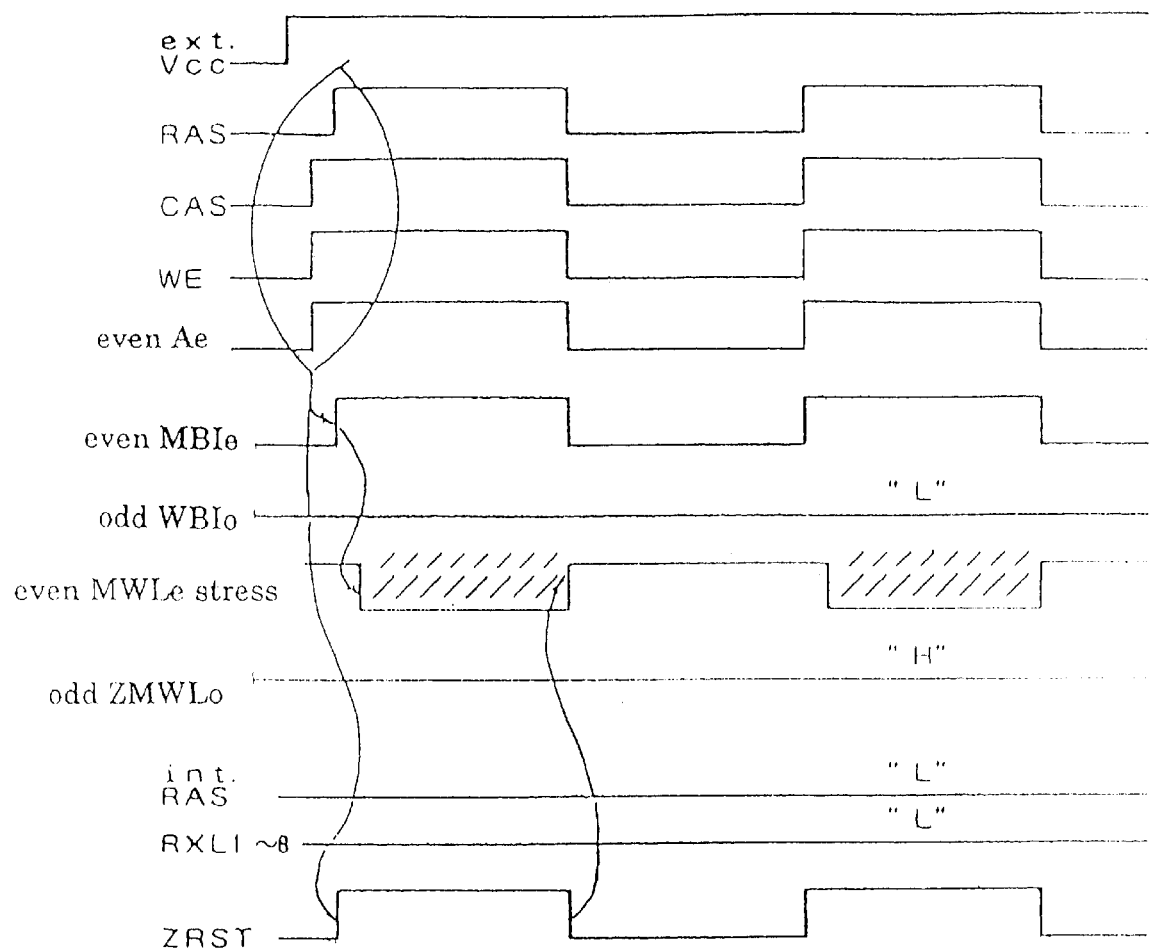

FIGS. 11–13 are a block diagram of a semiconductor storage device according to embodiment 4 of the invention, an example circuit of a main decoder 404b, and a timing chart of application of a main word lines ling-to-line stress voltage, respectively. This embodiment 4 uses the pre-decoder 104a shown in FIG. 5, the sub-decoder 104c shown in FIG. 2, and the WBI mode judgment circuits 205 shown in FIGS. 7A or 7B. Components in the embodiment 4 having corresponding components in the first and embodiment 2s are given the same reference symbols as in the first and embodiment 2s and will not be described.

As shown in FIG. 11, in the memory 400 according to the embodiment 4, a WGI stress voltage to be applied between the main word lines can be output from the main decoder 404b. Therefore, in the embodiment 4, the separation transfer gates Ga and the making transfer gates Gb used in the memories 100, 200, and 300 according to the embodiments 1 to 3 (see FIGS. 1, 4, and 9) are eliminated, and the portions 103a and 103b, the even-numbered MWL common portion 103e, and the odd-numbered MWL common portion 103o of the main word lines 103, the Pe input pad 12 common to the odd-numbered MWLs, and the Po input pad 11 common to the odd-numbered MWLs are also eliminated. That is, in the memory 400 according to the embodiment 4, the above eliminated means for applying a stress voltage between the main word lines are replaced by the main decoder 404b. Therefore, the memory 400 features the main decoder 404b that enables switching among the ordinary operation, the waiting operation, and the operation of applying a WBI stress voltage between the main word lines to be made freely.

As shown in FIG. 12, the circuit of the main decoder 404b is composed of m stages of unit decoding circuit sections where m is equal to the number of main word lines 103. In the unit decoding circuit section for an ith main word line, the difference between the main decoder 404b and the main decoder 104b according to the embodiments 1 to 3 (see FIG. 6) is that a 2-input NOR gate Ti is used instead of the output stage inverter Ii2 that outputs a main word line signal ZMWLi.

Receiving, at one of the two input terminals, a signal that appears at the output terminal N3 of the inverter Ii, the 2-input NOR gate Ti controls a data read signal and data write signal for the ith main word line in an ordinary operation state. When a transition is made from an ordinary operation state to a waiting state in which no block decode signals RXLi are input, the potential of the output terminal N3 of the inverter Ii turns to the low level "L" and hence the 2-input NOR gate Ti is not controlled.

Further, receiving, at the other input terminal of the 2-input NOR gate Ti, a WBIi signal that has been formed by the WBI mode judgment circuit 205, the 2-input NOR gate Ti controls a ZMWLi signal that serves as a WBI stress voltage for the ith main word line in a wafer burn-in operation state.

If the ith main word line is an odd-numbered one, the 2-input NOR gate Ti receives a WBIo signal for odd-numbered NWLs. If the ith main word line is an even-numbered one, the 2-input NOR gate Ti receives a WBIe signal for even-numbered NWLs. Therefore, in the main decoder 404b, the unit decoding circuit sections for the odd-numbered stages and those for the even-numbered stages are provided alternately. Since WBI address setting signals WBIo and WBIe are input to the NOR gates Ti of the main decoder 404b in the above manner, the odd-numbered main word lines and the even-numbered main word lines are supplied with different potentials, to establish a selection state in which a stress voltages is applied between the main word lines.

If a reset signal ZRST is input that is active when it is at a low level "L," the unit decoding circuit units for all the main word lines are reset to a non-selection state.

FIG. 13 is a timing chart shows how a transition is made from a waiting state to a WBI state in the wafer-like memory 400 in which the WBI mode judgment circuit 205 generates a WBI start timing signal and the main decoder 404b generates main word lines line-to-line stress voltages.

After establishment of an ext.Vcc potential, a mode signal true/false judgment is performed at a time point when both of CAS and WE signals are input before a RAS signal or an even-numbered MWL WBI setting address Ae is input. After a judgment that WBI mode signals are correct, a even-numbered MWL wafer burn-in signal WBIe rises in response to input of an external RAS signal as indicated by an arrow in FIG. 13. Subsequently, a ZMWLe signal for even-numbered MWLs falls that is an inverted version of the WBIe signal.

On the other hand, since no odd-numbered MWL WBI setting addresses Ao are input, a WBIo signal remains at a low level "L" and hence the potentials of the odd-numbered main word lines MWLo does not fall, that is, is kept at a high level "H" (non-selection). If a reset signal ZRST is input, the potential of the even-numbered main word lines MWLe turns to a high level "H" as shown in FIG. 13 and resetting to an inactive state is thereby made.

As described above, the memory 400 (see FIG. 11) according to the embodiment 4 of the invention is provided with a WBI mode judgment circuit means 205 for generating a stress application start signal int.ZWBIi in response to external wafer burn-in mode signals CAS, WE and RAS that are input from the respective pads 2–4 and address signals A1–An that are input from the input pads 5–6 and for generating internal stress voltages int.WBIo and int.WBIe for the odd-numbered MWLS and the even-numbered MWLs, respectively; and a control means of a line-to-line voltage between main word lines for applying the internal stress voltages int.WBIo and int.WBIe that have been generated by the WBI mode judgment circuit means 205 to every other main word line 103 via the main decoder 404b of the row decoder 404.

In summary, by using the main decoder 404b, the memory 400 improves the degree of coincidence in timing with external signals RAS, CAS, and WE. Further, the memory 400 can easily perform composite WBI mode operations including the operation of applying a stress voltage between the main word lines and the basic operations of a DRAM memory, that is, data reading, data writing, and refreshing.

Constituted as described above, the invention provides the following advantages.

Since a burn-in stress voltage can be applied between the main word lines, a latent defect in line-to-line insulation comes to appear and hence debugging can be performed in a reliable manner. This increases the reliability of memory products.

Since burn-in debugging is performed in a wafer state, defective products can be saved by using a redundancy technique. This increases the production yield.

A simple structure is provided in which a stress voltage is applied between the main word lines directly from an input pad. Capable of employing a long-pulse burn-in technique, the invention allows a burn-in operation to be performed in a short time.

Since the degree of coincidence in timing with burn-in mode signals can be increased, a burn-in operation can be performed in a more reliable manner.

Since the stress voltage generation circuit is incorporated in the memory, the timing controllability is improved and an external power supply and dedicated electrode pads for application of a stress voltage between the main word lines are not necessary. The latter advantage allows miniaturization of a memory chip.

Since a stress voltage is output from the row decoder, the timing controllability is greatly improved and it becomes possible to use a combined burn-in mode that includes another burn-in item. Further, a memory chip can be miniaturized.

Defective products can be saved by using a redundancy technique. Further, since a burn-in operation can be performed in a package state after an assembling step, the reliability of defective products that have been saved by using the redundancy technique can be checked.

By applying the invention to multiple division, layered structure memories in which the wiring pitch of the main word lines is now being reduced, exceptionally superior burn-in effect can be obtained by line-to-line stress voltage application.

Even a latent insulation defect between main word lines that is less likely to appear when ordinary RAS signal clock pulses are applied because of its high resistance value can be found surely in a short time by application of a stress voltage of long pulses.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 10-195409 filed on Jul. 10, 1998 including specification, claims, drawings and summary are incorporated herein by reference in its entirety.

What is claimed is:

1. A semiconductor storage device comprising:
   a cell array having a plurality of memory cells that are arranged in matrix form;
   a plurality of sub-word lines to serve as signal lines for selection in each row of said cell array;
   a plurality of main word lines to serve as signal lines for collective selection of a plurality of rows of said cell array via plural ones of said sub-word lines;
   a row decoder for generating a row selection signal for said main word lines and a row selection signal for said sub-word lines by decoding an address signal that is input externally;
   mutual switching means for switching among operation modes that include an ordinary operation mode, a waiting mode, and a burn-in mode; and
   line-to-line burn-in means of said main word lines for being capable to apply a different voltage respectively as a burn-in stress voltage between adjacent said main word lines in the burn-in mode.

2. The semiconductor storage device according to claim 1, wherein the semiconiductor storage device is of a wafer-like one, and said line-to-line burn-in means applies a wafer burn-in stress voltage that is responsive to a stress application start signal between adjacent ones of said main word lines in a wafer burn-in state.

3. The semiconductor storage device according to claim 1, wherein the semiconductor storage device is of a wafer-like one, the semiconductor storage device further comprising:

an electrode pad to which a stress voltage is input externally;

wiring means for supplying the stress voltage to every other one of said main word lines;

stress application start signal generating means for generating a stress application start signal when the stress voltage is applied to said electrode pad; and control means of a line-to-line voltage between said main word lines for supplying the stress voltage to every other one of said main word lines in response to the stress application start signal after separating said row decoder from said main word lines.

4. The semiconductor storage device according to claim 1, wherein the semiconductor storage device is of a wafer-like one, the semiconductor storage device further comprising:

an electrode pad to which a stress voltage is input externally;

wiring means for supplying the stress voltage from said electrode pad to every other one of said main word lines;

wafer burn-in mode judgment circuit means for generating a stress application start signal in response to a wafer burn-in mode signal and an address signal that are input externally; and control means of a line-to-line voltage between said main word lines for supplying the stress voltage to every other one of said main word lines in response to the stress application start signal after separating said row decoder from said main word lines.

5. The semiconductor storage device according to claim 1, wherein the semiconductor storage device is of a wafer-like one, the semiconductor storage device further comprising:

wafer burn-in mode judgment circuit means for generating a stress application start signal in response to a wafer burn-in mode signal and an address signal that are input externally, and for generating a stress voltage for every other one of said main word lines;

wiring means for supplying the stress voltage that has been generated by said wafer burn-in mode judgment circuit means to every other one of said main word lines; and control means of a line-to-line voltage between said main word lines for supplying the stress voltage to every other one of said main word lines in response to the stress application start signal after separating said row decoder from said main word lines.

6. The semiconductor storage device according to claim 1, wherein the semiconductor storage device is of a wafer-like one, the semiconductor storage device further comprising:

wafer burn-in mode judgment circuit means for generating a stress application start signal in response to a wafer burn-in mode signal and an address signal that are input externally, and for generating a stress voltage for every other one of said main word lines; and control means of a line-to-line voltage between main word lines for supplying the stress voltage to every other one of said main word lines via said row decoder in response to the stress application start signal, the stress voltage being generated for every other one of said main word lines.

7. The semiconductor storage device according to claim 1, wherein the semiconductor storage device is accommodated in a package, and wherein said line-to-line burn-in means of said main word lines applies a package burn-in stress voltage that is responsive to a burn-in start signal in a package burn-in state between adjacent ones of said main word lines.

8. The semiconductor storage device according to claim 1, wherein the semiconductor storage device is a dynamic random access memory in which a plurality of said main word lines and a plurality of said sub-word lines are formed so as to have a layered word line structure.

9. The semiconductor storage device according to claim 1, wherein the burn-in stress voltage has repetitive voltage pulses having a pulse width that is longer than a clock pulse width of an external row address strobe control signal in the ordinary operation mode.

10. A semiconductor storage device comprising:

a cell array having a plurality of memory cells that are arranged in matrix form;

a plurality of wirings including a polysilicon to serve as signal lines for selection of the memory cells connected to the memory cells;

a plurality of metal wirings to serve as signal lines for selection of said plurality of wirings including a polysilicon;

a first decoder for generating a selection signal for said metal wirings by decoding an address signal that is input externally;

a second decoder for generating a selection signal for said wirings including a polysilicon according to the selection signal for said metal wirings; and a circuit for being capable to apply a different voltage respectively as a test stress voltage between adjacent said metal wirings in the test mode.

11. The semiconductor storage device according to claim 10, wherein said plurality of wirings including a polysilicon are arranged between said metal wirings corresponding to the selection.

* * * * *